(12) United States Patent
Kurita

(10) Patent No.: US 7,812,457 B2
(45) Date of Patent: *Oct. 12, 2010

(54) SEMICONDUCTOR DEVICE AND SEMICONDUCTOR WAFER AND A METHOD FOR MANUFACTURING THE SAME

(75) Inventor: Yoichiro Kurita, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/834,094

(22) Filed: Aug. 6, 2007

(65) Prior Publication Data

US 2007/0278698 A1    Dec. 6, 2007

Related U.S. Application Data

(63) Continuation of application No. 11/142,417, filed on Jun. 2, 2005.

(30) Foreign Application Priority Data

Jun. 30, 2004  (JP) .............................. 2004-194667

(51) Int. Cl.
  *H01L 23/48*  (2006.01)
  *H01L 23/52*  (2006.01)
  *H01L 29/40*  (2006.01)
(52) U.S. Cl. ...................... 257/777; 257/686; 257/723; 438/109; 438/110
(58) Field of Classification Search ......... 257/777–778, 257/723, 781, 686, E27.137, E27.144, E27.161; 438/109, 110
See application file for complete search history.

(56) References Cited

U.S. PATENT DOCUMENTS

| 6,087,719 | A  | * | 7/2000  | Tsunashima ................ 257/686 |
| 6,239,495 | B1 | * | 5/2001  | Sakui et al. ................ 257/777 |
| 6,307,270 | B1 |   | 10/2001 | Shen |
| 6,559,539 | B2 |   | 5/2003  | Tu et al. |
| 6,627,983 | B2 |   | 9/2003  | Tu et al. |
| 6,836,025 | B2 |   | 12/2004 | Fujisawa et al. |
| 6,870,249 | B2 |   | 3/2005  | Egawa |
| 6,876,066 | B2 |   | 4/2005  | Fee et al. |
| 7,045,899 | B2 |   | 5/2006  | Yamane et al. |
| 2002/0096730 | A1 | | 7/2002  | Tu et al. |

(Continued)

FOREIGN PATENT DOCUMENTS

JP        8-125120 A    5/1996

(Continued)

Primary Examiner—Thao X Le
Assistant Examiner—Thanh Y Tran
(74) Attorney, Agent, or Firm—Sughrue Mion, PLLC

(57) ABSTRACT

The semiconductor device 1 has a semiconductor chip 10 (first semiconductor chip) and a semiconductor chip 20 (second semiconductor chip). The semiconductor chip 20 is formed on the semiconductor chip 10. The semiconductor chip 20 is constituted by comprising a semiconductor substrate 22. The semiconductor substrate 22, which is an SOI substrate, is constituted by comprising an insulating layer 34, and a silicon layer 36, which is provided on the insulating layer 34, including a circuit forming region A1. The insulating layer 34 functions as a protective film (a first protective film) covering a lower face (a face opposite to the semiconductor chip 10) of the circuit forming region A1. A protective film 38 (a second protective film) is provided on the semiconductor substrate 22. The protective film 38 covers a side face of the circuit forming region A1.

13 Claims, 6 Drawing Sheets

U.S. PATENT DOCUMENTS

| | | |
|---|---|---|
| 2003/0227095 A1 | 12/2003 | Fujisawa et al. |
| 2004/0080040 A1 | 4/2004 | Dotta et al. |
| 2006/0014364 A1* | 1/2006 | Kurita ........................ 438/464 |

FOREIGN PATENT DOCUMENTS

| | | |
|---|---|---|
| JP | 2000-114206 A | 4/2000 |
| JP | 2000-208702 A | 7/2000 |
| JP | 2001-189419 A | 7/2001 |
| JP | 2001-250913 A | 9/2001 |

* cited by examiner

SEMICONDUCTOR DEVICE AND SEMICONDUCTOR WAFER AND A METHOD FOR MANUFACTURING THE SAME

This application is based on Japanese patent application NO. 2004-194667, the content of which is incorporated hereinto by reference.

BACKGROUND OF THE INVENTION

1. Field of the Invention

The present invention relates to a semiconductor device and a semiconductor wafer and a method for manufacturing the semiconductor device and the semiconductor wafer.

2. Related Art

In the Japanese Laid-Open patent Publication No. 2000-208702 and the Japanese Laid-Open Patent Publication No. 1996-125120 (H08-125120), the conventional semiconductor device is described. In the manufacturing process of the semiconductor device described in the Japanese Laid-Open Patent Publication No. 2000-208702, firstly, two SOI (Silicon On Insulator) wafers in which the silicon layer is formed on the silicon substrate (support substrate) via the insulating layer are prepared. Continuously, on one wafer (the first wafer) to become the base wafer, the other wafer (a second wafer) is formed into a layered structure such that the both silicon layers are faced to each other. Thereafter, the support substrate of the second wafer is removed.

Moreover, in the manufacturing process of the semiconductor device described in the Japanese Laid-Open Patent Publication No. 1996-125120, firstly, a first LSI and a second LSI both provided with an SOI substrate are prepared. Continuously, the second LSI is formed on the first LSI, after removing the support substrate of the SOI substrate in the second LSI.

SUMMARY OF THE INVENTION

However, it has now been discovered that when using the process in which wafers are formed into layered structure (wafer on wafer process), as the described technique in the Japanese Laid-Open Patent Publication No. 2000-208702, in order that the semiconductor device after dicing becomes non-defective product, both circuit parts formed at a position faced to each other on two wafers should be non-defective products. That is, even if one circuit part is non-defective product, when the other circuit part is defective product, the semiconductor device obtained from them results in defective product. Consequently, there has been a problem that the method for forming wafers into layered structure is not capable of obtaining sufficiently high yield.

In order to solve such problem, it is suitable to use a process in which the second wafer is made to be chip by dicing, thereafter, the second wafer with chip state is formed on the first wafer into the layered structure (chip on wafer process). In such a way as above, it is possible to form only the chips ascertained as the non-defective product on the first wafer, thereby it is possible to obtain the semiconductor device with a high yield.

Moreover, particularly the semiconductor device with height reduction is strongly desired in the layered type semiconductor device; therefore, as described in the Japanese Laid-Open Patent Publication No. 2000-208702, there is conducted to remove the support substrate of the second wafer. Also, in the technique described in the Japanese Laid-Open Patent Publication No. 1996-125120, as described above, the support substrate of the SOI substrate in the second LSI is removed. However, in the method for manufacturing the semiconductor device described in the Japanese Laid-Open Patent Publication No. 1996-125120, the support substrate is removed before the second LSI is formed on the first LSI into the layered structure. In this case, sufficient thickness should be secured for handling of the second LSI, for this reason, height reduction of the second LSI is limited. Consequently, it is preferable that removing of the support substrate is performed after the second LSI is formed on the first LSI.

However, structure of the conventional semiconductor device is not suitable for removing the silicon substrate after forming wafers in the chip on wafer process.

According to the present invention, there is provided a semiconductor device comprising: a first semiconductor chip, and a second semiconductor chip, which has a semiconductor substrate including a circuit forming region, formed on the first semiconductor chip, wherein the second semiconductor chip has a first protective film covering a face opposite to the first semiconductor chip in the circuit forming region and has a second protective film covering a side face of the circuit forming region.

In the semiconductor device thus constructed, the lower face of the circuit forming region of the second semiconductor chip (the face opposite to the first semiconductor) and the side face of the circuit forming region of the second semiconductor chip are respectively covered with the first protective film and the second protective film. That is, an exposed face of the second semiconductor chip formed on the first semiconductor chip is covered with these protective films. Therefore, the semiconductor device has a structure suitable for performing removing of the support substrate, after forming the second semiconductor chip in a chip on wafer process.

An area of the first semiconductor chip may be larger than an area of the second semiconductor chip. In this case, a face of the first semiconductor chip at the side of the second semiconductor chip results in a state where a region on which the second semiconductor chip is not formed is generated. This region is capable of being utilized, for instance, as a forming region of the external interconnect.

The semiconductor substrate may be constituted by comprising an insulating layer functioning as the first protective film, and a silicon layer, which is provided on the insulating layer, including the circuit forming region. The insulating layer may be exposed on a face opposite to the first semiconductor chip in the second semiconductor chip. In this case, the semiconductor device with height reduced is obtained because the support substrate of the second semiconductor chip is removed.

According to the present invention, there is provided a semiconductor wafer comprising a base wafer, and a semiconductor chip, which has a semiconductor substrate including a circuit forming region, formed on the base wafer, wherein the semiconductor chip has a first protective film covering a face opposite to the base water in the circuit forming region and has a second protective film covering a side face of the circuit forming region.

In the semiconductor wafer thus constructed, a lower face and a side face of the circuit forming region of the semiconductor chip are respectively covered with the first protective film and the second protective film. That is, the exposed face of the semiconductor chip formed on the base wafer is covered with these protective films. Therefore, the semiconductor wafer has structure suitable for performing removing of the support substrate after forming the semiconductor chip in the chip on wafer process.

A plurality of semiconductor chips may be provided on the base wafer at a predetermined interval. In this case, it is possible to obtain a plurality of semiconductor devices by dicing the region in which the semiconductor chip is not provided in the base wafer.

According to the present invention, there is provided a method for manufacturing a semiconductor device in which a semiconductor chip having an SOI substrate including a circuit forming region, comprising: preparing a base wafer; preparing a semiconductor chip in which there is provided the SOI substrate constituted by comprising a support substrate, an insulating layer, which is provided on the support substrate, functioning as a first protective film covering a face opposite to the base wafer in the circuit forming region, and a silicon layer, which is provided on the insulating layer, including the circuit forming region, and preparing the semiconductor chip having a second protective film covering a side face of the circuit forming region; forming the semiconductor chip on the base wafer such that a side of the silicon layer is faced to the base wafer; and removing the support substrate of the semiconductor chip formed on the base wafer by etching.

In this manufacturing method, the semiconductor chip in which the lower face and the side face of the circuit forming region are respectively covered with the first protective film and the second protective film is prepared. That is, the exposed face of the semiconductor chip formed on the base wafer is covered with these protective films in the forming. Therefore, in the removing, it is possible to perform etching of the support substrate stably. Consequently, it is possible to obtain the semiconductor device with height reduced.

According to the present invention, there is provided a method for manufacturing a semiconductor device in which a second semiconductor chip having an SOI substrate including a circuit forming region is formed on a first semiconductor chip, comprising: preparing a base wafer where the base wafer including the first semiconductor chip is prepared; preparing a semiconductor chip in which there is provided the SOI substrate constituted by comprising a support substrate, an insulating layer, which is provided on the support substrate, functioning as a first protective film covering a face opposite to the first semiconductor chip in the circuit forming region, and a silicon layer, which is provided on the insulating layer, including the circuit forming region; and preparing the second semiconductor chip having a second protective film covering a side face of the circuit forming region; forming the second semiconductor chip on a part corresponding to the first semiconductor chip on the base wafer into a layered structure such that a side of silicon layer is faced to the base wafer; removing the support substrate of the second semiconductor chip formed on the base wafer by etching; and dicing the base wafer such that the first semiconductor chip is divided into pieces, after removing.

In this manufacturing method, the second semiconductor chip in which the lower face and the side face of the circuit forming region are respectively covered with the first protective film and the second protective film is prepared. That is, the exposed face of the second semiconductor chip formed on the first semiconductor chip is covered with these protective films in forming the semiconductor chip. Therefore, it is possible to perform etching of the support substrate stably in the removing. Consequently, it is possible to obtain the semiconductor device with height reduced.

According to the present invention, there is provided a method for manufacturing a semiconductor wafer in which a semiconductor chip having an SOI substrate including a circuit forming region is formed on a base wafer, comprising: preparing a base wafer where the base wafer is prepared; preparing a semiconductor chip in which there is provided the SOI substrate constituted by comprising a support substrate, an insulating layer, which is provided on the support substrate, functioning as a first protective film covering a face opposite to the base wafer in the circuit forming region, and a silicon layer, which is provided on the insulating layer, including the circuit forming region, and preparing the semiconductor chip having a second protective film covering a side face of the circuit forming region; forming the semiconductor chip on the base wafer such that a side of the silicon layer is faced to the base wafer; and removing the support substrate of the semiconductor chip formed on the base wafer by etching.

In this manufacturing method, the semiconductor chip in which the lower face and the side face of the circuit forming region are respectively covered with the first protective film and the second protective film is prepared. That is, the exposed face of the semiconductor chip formed on the base wafer is covered with these protective films in the forming. Therefore, in the removing, it is possible to perform etching of the support substrate stably. Consequently, it is possible to obtain the semiconductor wafer with height reduced.

According to the present invention, the semiconductor device and the semiconductor wafer with structure suitable for realizing high yield and reducing height and the method for manufacturing them are realized.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

The invention will now be described herein with reference to illustrative embodiments. Those skilled in the art will recognize that many alternative embodiments can be accomplished using the teachings of the present invention and that the invention is not limited to the embodiments illustrated for explanatory purposed.

There will be described an embodiment of a semiconductor device and a semiconductor wafer and a method for manufacturing the same according to the present invention in detail with reference to the drawings below. It should be noted that, in the description of the drawings, duplicate description is not presented while adding the same symbol to the same component.

Figure 1:
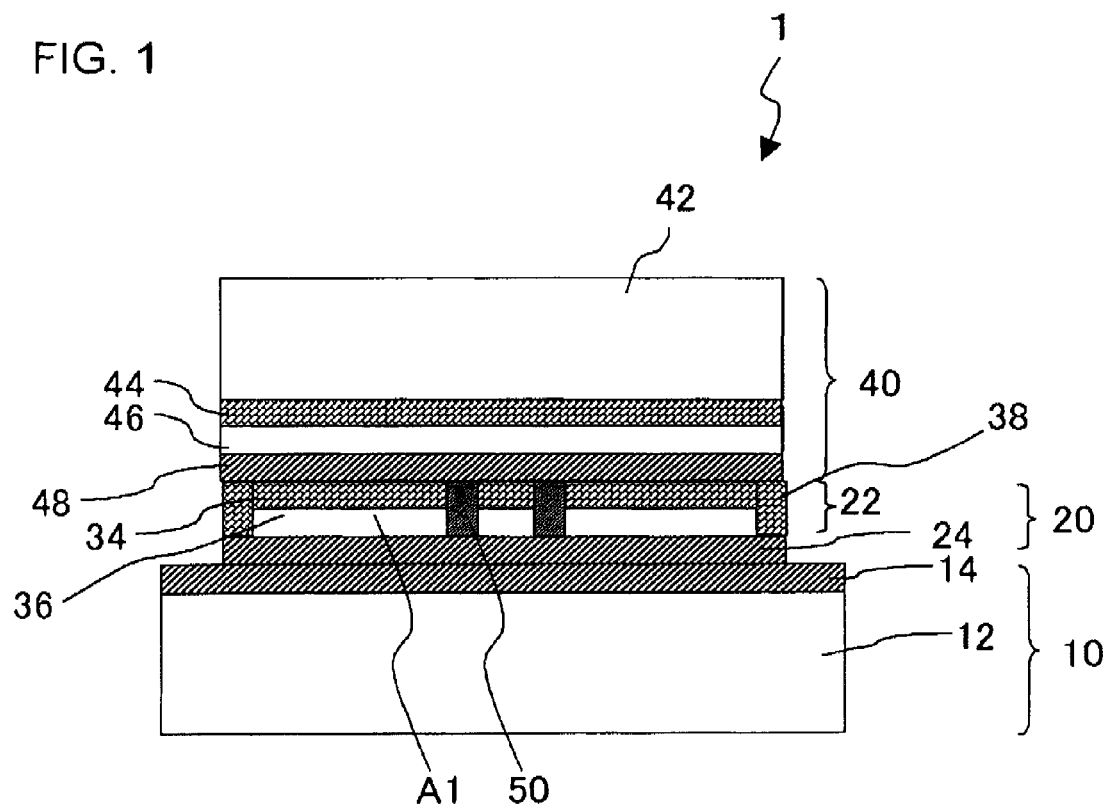
FIG. 1 is a cross sectional view schematically showing a structure of a semiconductor device according to an embodiment.

The semiconductor device 1 shown in FIG. 1 has a first semiconductor chip (semiconductor chip 10), and a second semiconductor chip (semiconductor chip 20), which has a semiconductor substrate 22 including a circuit forming region A1, formed on the first semiconductor chip with a layered structure. The second semiconductor chip has a first protective film (insulating layer 34) covering a face opposite to the first semiconductor chip in the circuit forming region A1, and a second protective film (protective film 38) covering a side face of the circuit forming region A1.

Figure 2:
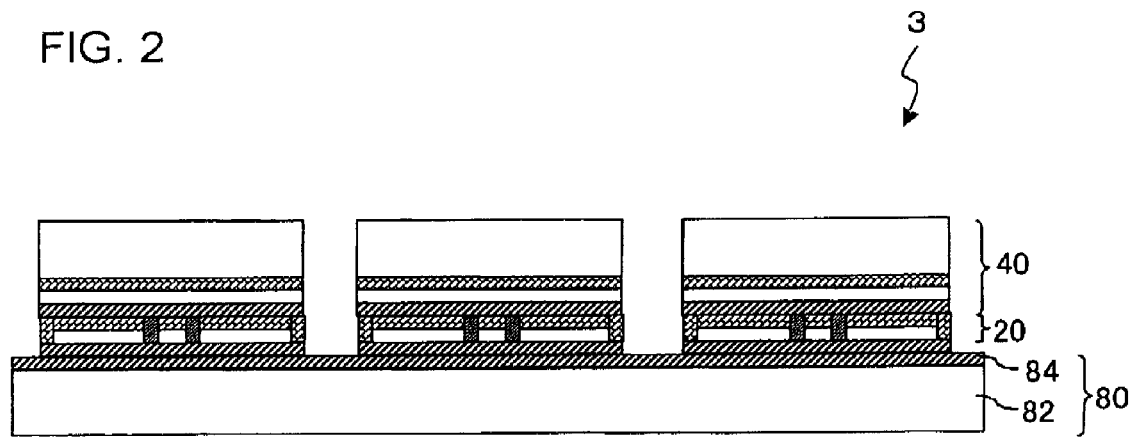
FIG. 2 is a cross sectional view schematically showing a structure of a semiconductor wafer according to the embodiment.

A semiconductor wafer 3 shown in FIG. 2 has a base wafer 80, and a semiconductor chip 20, which has a semiconductor substrate 22 including the circuit forming region A1, formed on the base wafer 80. The semiconductor chip 20 has the first protective film (insulating layer 34) covering a face opposite to the base wafer 80 in the circuit forming region A1, and the second protective film (protective film 38) covering a side face of the circuit forming region A1.

A method for manufacturing the semiconductor 1 shown in FIGS. 3 to 10 comprises: preparing a base wafer 80 where the base wafer 80 including the first semiconductor chip (semiconductor chip 10) is prepared; preparing a semiconductor chip in which there is provided the SOI substrate (SOI wafer) constituted by comprising a support substrate 32, an insulating layer 34, which is provided on the support substrate 32, functioning as a first protective film covering a face opposite to the first semiconductor chip in the circuit forming region A1, and a silicon layer 36, which is provided on the insulating layer 34, including the circuit forming region A1, and preparing the second semiconductor chip (semiconductor chip 20) having a second protective film (protective film 38) covering a side face of the circuit forming region A1; forming the second semiconductor chip on a part corresponding to the first semiconductor chip on the base wafer 80 into a layered structure such that a side of the silicon layer 36 is faced to the base wafer 80; removing the support substrate 32 of the second semiconductor chip formed on the base wafer 80 with the layered structure by etching; and dicing the base wafer 80 such that the first semiconductor chip is divided into pieces, after removing.

A method for manufacturing the semiconductor wafer 3 shown in FIGS. 3 to 10 includes: preparing a base wafer 80 where the base wafer 80 is prepared; preparing a semiconductor chip in which there is provided the SOI substrate (SOI wafer) constituted by comprising a support substrate 32, an insulating layer 34, which is provided on the support substrate 32, functioning as a first protective film covering a face opposite to the base wafer 80 in the circuit forming region A1, and a silicon layer 36, which is provided on the insulating layer 34, including the circuit forming region A1, and preparing the semiconductor chip 20 having a second protective film (protective film 38) covering a side face of the circuit forming region A1; forming the semiconductor chip 20 on the base wafer 80 such that a side of the silicon layer 36 is faced to the base wafer 80; and removing the support substrate 32 of the semiconductor chip 20 formed on the base wafer 80 with the layered structure by etching.

FIG. 1 is a cross-sectional view showing the semiconductor device according to the present embodiment. The semiconductor device 1 is provided with the semiconductor chip 10 (the first semiconductor chip), the semiconductor chip 20 (the second semiconductor chip) and the semiconductor chip 40 (the third semiconductor chip). The semiconductor chip 10 is constituted by comprising a semiconductor substrate 12 such as the silicon substrate or the like, and an interconnect layer 14 provided on the semiconductor substrate 12.

The semiconductor chip 20 is formed on the semiconductor chip 10. The semiconductor chip 20 is constituted by comprising the semiconductor substrate 22 and an interconnect layer 24 provided on the semiconductor substrate 22. The interconnect layer 14 of the semiconductor chip 10 and the interconnect layer 24 of the semiconductor chip 20 are faced to each other. Moreover, in the present embodiment, an area of the semiconductor chip 10 is larger than an area of the semiconductor chip 20. Consequently, the side face of the semiconductor chip 20 is located inside the side face of the semiconductor chip 10, while the side face of the semiconductor chip 10 projects toward outside the semiconductor chip 20.

The semiconductor substrate 22, which is the SOI substrate, is constituted by comprising the insulating layer 34 and the silicon layer 36, which is provided on the insulating layer 34, including the circuit forming region A1. Here, the circuit forming region A1 is a region within the semiconductor substrate 22; and, in the circuit forming region A1, component of a circuit device is provided. The component of the circuit device is, for instance, a diffusion layer functioning as a source-drain region of a transistor and the like. The insulating layer 34 functions as the protective film (the first protective film) covering the whole lower face (an opposite side face to the semiconductor chip 10) of the circuit forming region A1. It should be noted that the insulating layer 34 does not strictly cover the lower face in a part where a through electrode 50 described later is provided, however it is possible to regard that the insulating layer 34 covers the whole lower face substantially. The insulating layer 34 is exposed to the lower face (the opposite side face to the semiconductor chip 10) of the semiconductor chip 20. The insulating layer 34 is constituted with a material having an etchant resistance. The insulating layer 34 is constituted with, for instance, $SiO_2$ or the like.

In the semiconductor substrate 22, protective film 38 (the second protective film) is provided. The protective film 38 covers the whole side face of the circuit forming region A1. Moreover, the protective film 38 reaches the insulating layer 34 from the silicon layer 36. Specifically, the protective film 38 extends to inner part of the insulating layer 34 originating from the surface of the silicon layer 36 while penetrating the silicon layer 36. The protective film 38 is constituted with a material having an etchant resistance. The protective film 38 is constituted with, for instance, the insulating film such as $SiO_2$ or the like, or metal film such as Cu, W or the like. It should be noted that the protective film 38 may be constituted by having both the insulating film and the metal film. Even though the protective film 38 does not cover strictly the whole side face in such a case where the protective film 38 is partially notched to be provided, however, it is suitable that the whole side surface is substantially covered.

In the present embodiment, also a side face of the interconnect layer 24 is covered with a protective film (the third protective film) not shown in the drawing. The protective film, which is, for instance, a seal ring, is constituted with material having an etchant resistance. Moreover, as for material of the protective film, for instance, it is possible to use the same material as the interconnect inside the interconnect layer 24.

In the circuit forming region A1, the through electrode 50 is provided. The through electrode 50 reaches the insulating layer 34 from the silicon layer 36. Specifically, the through electrode 50 extends to an inner part of the insulating layer 34 originating from a surface of the silicon layer 36 while penetrating the silicon layer 36. In the present embodiment, both end face positions of the above described protective film 38 and the through electrode 50 at the side of the insulating layer 34 is the approximately same as the position of the surface of the insulating layer 34.

The semiconductor chip 40 is formed on the semiconductor chip 20. The semiconductor chip 40 has the support substrate 42, the insulating layer 44 provided on the support substrate 42, and the SOI substrate constituted from the silicon layer 46 provided on the insulating layer. The support substrate 42 is, for instance, the silicon substrate or the like. Moreover, the interconnect layer 48 is provided on the silicon layer 46. The lower face of the semiconductor chip 20 and the interconnect layer 48 of the semiconductor chip 40 are disposed so as to be faced to each other. However, it is not always necessary for the semiconductor chip 40 to be constituted by comprising the SOI substrate; it is suitable to be constituted by comprising the other kinds of semiconductor substrate.

FIG. 2 is a cross-sectional view showing one embodiment of the semiconductor wafer according to the present invention. The semiconductor wafer 3 has the base wafer 80, the semiconductor chip 20 and the semiconductor chip 40. Constitution of the semiconductor chip 20 and the semiconductor chip 40 are the same as that shown in FIG. 1. The base wafer 80 is constituted by comprising the semiconductor substrate 82 such as the silicon substrate or the like, and the interconnect layer 84 on the semiconductor substrate 82. It should be noted that, as for the base wafer 80, it is not limited to general wafer in which the LSI including the transistor is provided; it is suitable that a passive element or only conductive pattern may be provided on the base wafer.

On the base wafer 80, a plurality of semiconductor chips 20 are formed with predetermined intervals into layered structure. The interval is set to be larger than thickness of a dicing blade used on the occasion of dicing the base wafer 80.

Figure 3:
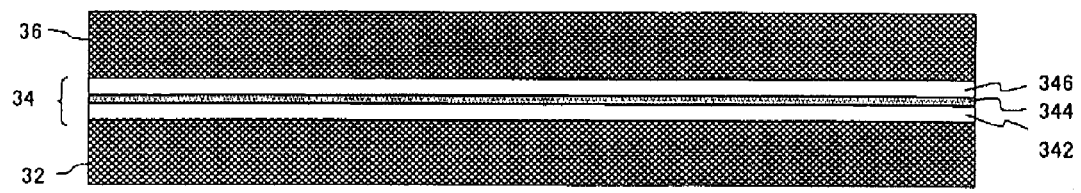
FIG. 3 is a cross sectional process view schematically showing a method for manufacturing respective semiconductor devices and semiconductor wafers according to the embodiment.

There will be explained one example of the method for manufacturing the semiconductor device 1 and the semiconductor wafer 3, as one embodiment of the method for manufacturing the respective semiconductor device and semiconductor wafer according to the present invention with reference to FIGS. 3 to 10. Firstly, a $SiO_2$ film 342, a SiN film 344 and a $SiO_2$ film 346 are sequentially formed on the first silicon wafer to become the support substrate 32 into a layered structure. On the first silicon wafer, the second silicon wafer to become the silicon layer 36 is attached; and it is annealed in a vacuum, thus the SOI wafer, in which the insulating layer 34 and the silicon layer 36 are formed on the support substrate 32 into a layered structure, is obtained. That is, the insulating layer 34 in the present embodiment is constituted as a multilayered film composed of the $SiO_2$ film 342, the SiN film 344 and the $SiO_2$ film 346 (FIG. 3). It should be noted that it is suitable that a SiCN film or a SiON film, or combination thereof may be used instead of the SiN film 344 or in addition to the SiN film 344.

Figure 4:
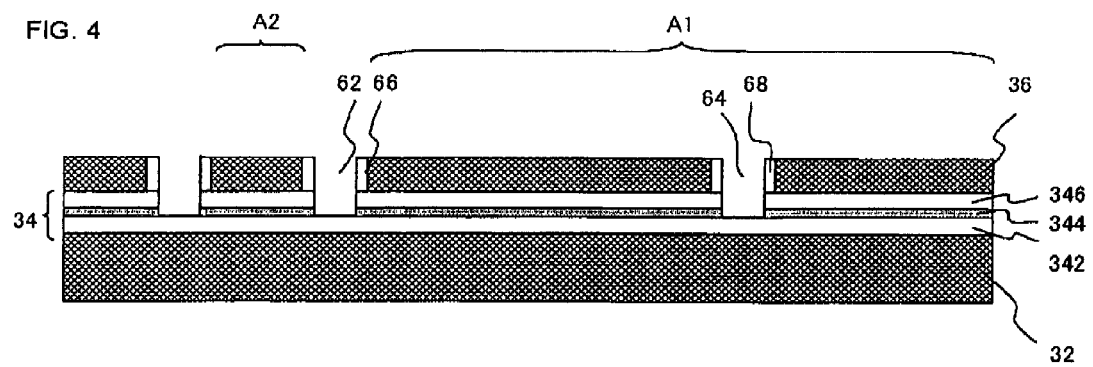
FIG. 4 is a cross sectional process view schematically showing a method for manufacturing respective semiconductor devices and semiconductor wafers according to the embodiment.

Next, a trench 62 reaching the insulating layer 34 from the silicon layer 36 is formed along a boundary between the circuit forming region A1 and a scribe line region A2, for instance, by dry etching technique. In the present embodiment, the trench 62 and a hole 64 for the through electrode 50 are formed simultaneously. Furthermore, an insulating film 66 and an insulating film 68 are formed upon thermal oxidizing the silicon layer 36 with this condition (FIG. 4).

Figure 5:
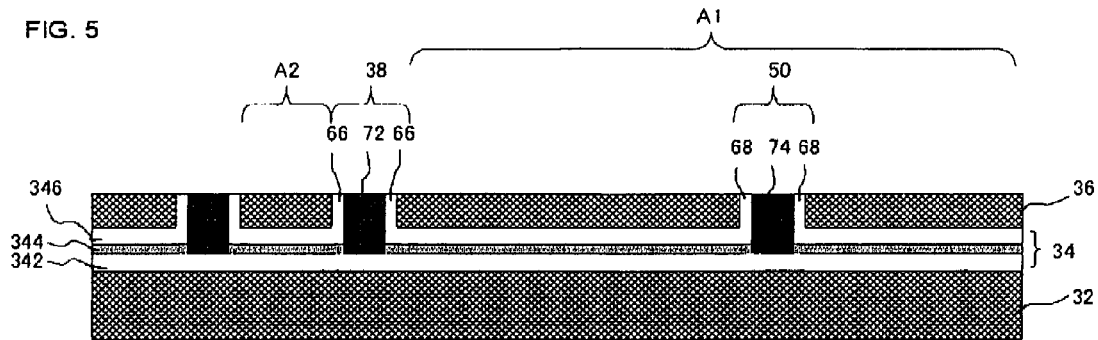
FIG. 5 is a cross sectional process view schematically showing a method for manufacturing respective semiconductor devices and semiconductor wafers according to the embodiment.

Next, a metal film 72 is formed upon embedding metal into the trench 62 (FIG. 5). Having such process, the protective film 38 is formed. That is, in the present embodiment, the protective film 38 is formed with both the insulating film 66 and the metal film 72. At this time, the metal film 74 is also filled into the hole 64 at the same time as filling the trench 62. Therefore, the through electrode 50, which is constituted with both the insulating film 68 and the metal film 74, is formed. Filling the metal in the trench and the hole is performed by forming Cu or W by plating technique or CVD technique, after forming, for instance, barrier metal such as TiN, TaN or Ta or the like. Furthermore, the metal film formed other than inner part of the trench 62 and the hole 64, and the insulating film above the silicon layer 36 are removed.

Figure 6:
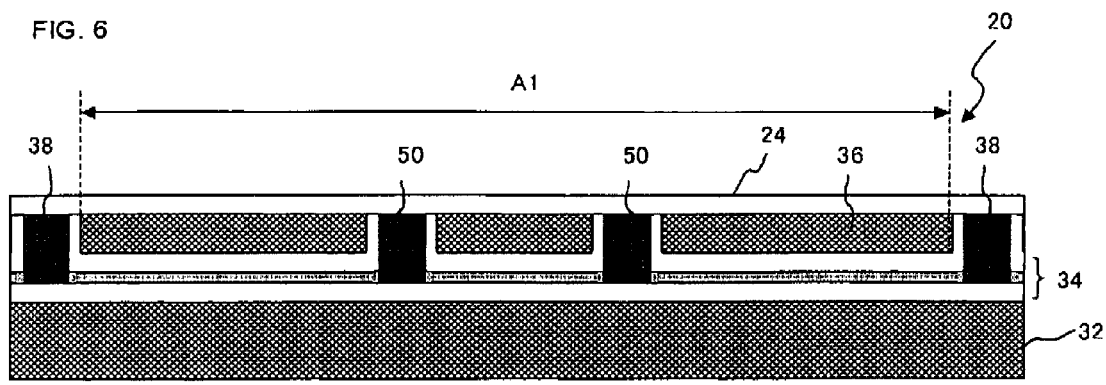
FIG. 6 is a cross sectional process view schematically showing a method for manufacturing respective semiconductor devices and semiconductor wafers according to the embodiment.

Next, a plurality of semiconductor chips 20 are obtained upon performing dicing of the scribe line region A2, after forming necessary circuit and an interconnect layer 24 on the circuit forming region A1 (FIG. 6). The process manufacturing the semiconductor chip 20 as above is called as the semiconductor chip preparing process.

Figure 7:
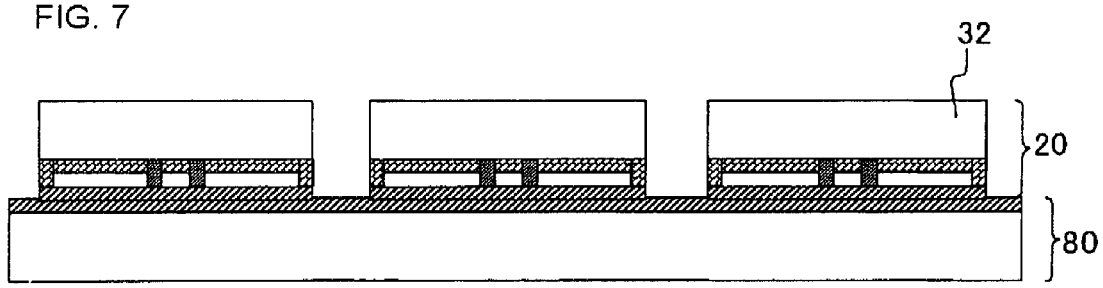
FIG. 7 is a cross sectional process view schematically showing a method for manufacturing respective semiconductor devices and semiconductor wafers according to the embodiment.

Successively, the base wafer 80 is prepared (base wafer preparing process). It should be noted that the order executing the semiconductor chip preparing process and the base wafer preparing process is arbitral. The semiconductor chip 20 is formed on the base wafer 80 (forming process) into the layered structure. It is possible to use, for instance, activated bonding process for the bonding between the base wafer 80 and the semiconductor chip 20. The surface activated bonding process flattens the both bonded surfaces using a CMP technique (Chemical Mechanical Polishing technique) or the like. Then, the opposite electrodes and the opposite insulating films are activated using plasma irradiation technique or the like. The bonding is performed with activated condition kept. It should be noted that it is suitable to perform the bonding between electrodes and the resin sealing while using the general flip chip bonding process. In the present embodiment, a plurality of semiconductor chips 20 is formed on the base wafer 80 at a predetermined interval, into a layered structure (FIG. 7).

Figure 8:
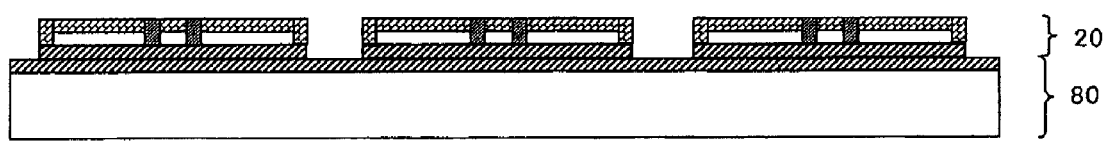
FIG. 8 is a cross sectional process view schematically showing a method for manufacturing respective semiconductor devices and semiconductor wafers according to the embodiment.
Figure 9:
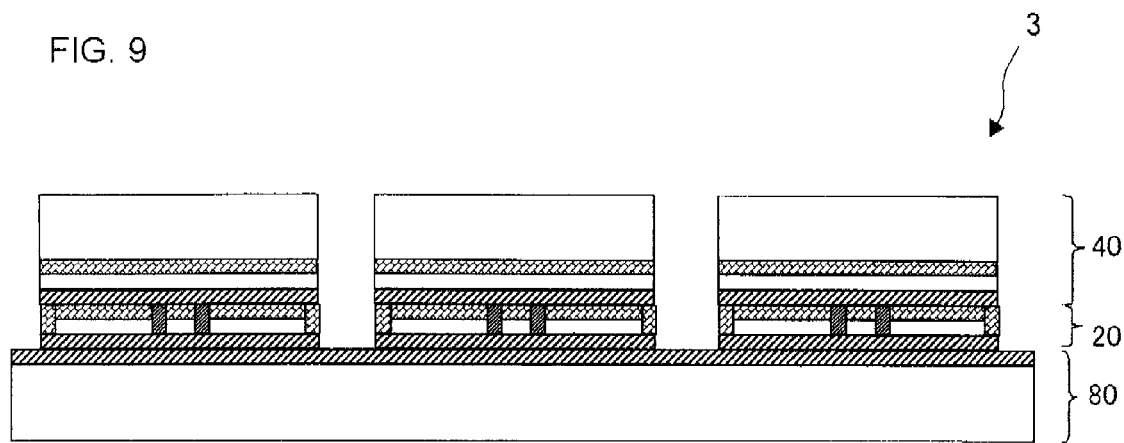
FIG. 9 is a cross sectional process view schematically showing a method for manufacturing respective semiconductor devices and semiconductor wafers according to the embodiment.

Next, the support substrate 32 is removed from the semiconductor chip 20 by, for instance, wet etching technique (removing process). In removing the support substrate 32, it is also suitable that the support substrate 32 may be removed to some extent using mechanical polishing technique or the like, before performing wet etching. Having such process, the productivity of the semiconductor device 1 and the semiconductor wafer 3 is improved (FIG. 8). Furthermore, the semiconductor chip 40 is prepared, and then the semiconductor chip 40 is formed on the semiconductor chip 20 with a layered structure. According to the above process, the semiconductor wafer 3 is obtained (FIG. 9).

Figure 10:
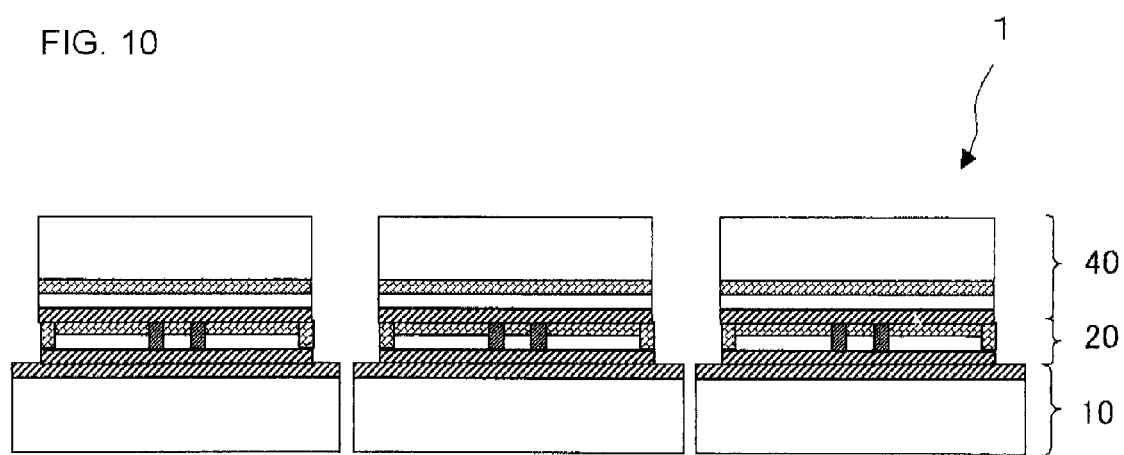
FIG. 10 is a cross sectional process view schematically showing a method for manufacturing respective semiconductor devices and semiconductor wafers according to the embodiment.

Moreover, the region where the semiconductor chip 20 is not provided in the base wafer 80 is diced. In such a way as above, the semiconductor device 1 is obtained (FIG. 10).

There will be described effects of the present embodiment.

In the present embodiment, the lower face and the side face of the circuit forming region A1 of the semiconductor chip 20 are covered with the insulating layer 34 and the protective film 38 respectively. That is, an exposed surface of the semiconductor chip 20 formed on the semiconductor chip 10 (or base wafer 80) is covered with these protective films. For this reason, the semiconductor device 1 and the semiconductor wafer 3 have a suitable structure for performing the removing of the support substrate 32, after forming the semiconductor chip 20 into the layered structure in the chip on wafer process. That is, when removing the support substrate 32 by the wet etching technique, it is possible to protect the circuit forming region A1 from the etchant with the above protective films (the insulating layer 34 and the protective film 38). Therefore, in the removing process, it is possible to perform etching of the support substrate 32 stably.

Also, the third protective film with an etchant resistance is provided at a side face of the interconnect layer 24; therefore, it is possible to perform etching of the support substrate 32 more stably. However, to provide the third protective film is not indispensable. For instance, when an interlayer insulating film of the interconnect layer 24 has sufficient etchant resistance, stability of the etching is kept sufficiently even though the third protective film is not provided. It should be noted that the above protective film 38 may be provided so as to cover the whole side face of the interconnect layer 24 instead of the third protective film or in addition to the third protective film. That is, it is suitable that the protective film 38 may be provided so as to cover not only the side face of the circuit forming region A1 but also the side face of the interconnect layer 24. In this case, the semiconductor device capable of performing the etching of the support substrate 32 more stably with simple constitution is realized. In order to obtain the protective film 38 having such constitution, formation of the protective film 38 may be executed after formation of the circuit forming region A1 and interconnect layer 24, It should be noted that, in the interconnect layer 24, in addition to the interconnect, various circuit elements such as electrode terminals, various passive elements or the like may be included.

In the above embodiment, the semiconductor device 1 and the semiconductor wafer 3 are manufactured using the chip on wafer process. Consequently, it becomes possible to form only the semiconductor chip 20 ascertained as non-defective product previously on the base wafer 80 into the layered structure. For this reason, it is possible to obtain the semiconductor device 1 and the semiconductor wafer 3 with high yield. Furthermore, since the chip on wafer process is used, it is possible to obtain easily the semiconductor device in which the semiconductor chip with different size is formed into the layered structure. That the semiconductor chips with different size are capable of being formed in the layered structure leads to improvement of the degree of freedom in layout of the semiconductor device.

Moreover, removing of the support substrate 32 is executed, after forming the semiconductor chip 20 on the base wafer 80 into the layered structure. For this reason, unlike the semiconductor device described in the Japanese Laid-Open Patent Publication No. 1996-125120, it is not necessary to secure the thickness required in a case where the semiconductor chip 20 is subjected to handling independently. Consequently, it is possible to obtain the very thin semiconductor chip 20. That the each semiconductor chip is made thin is leads to height reduction of the semiconductor device in which each thin semiconductor chips are formed into the layered structure.

In the semiconductor device 1, an area of the semiconductor chip 10 is larger than an area of the semiconductor chip 20. Having such configuration, a region where the semiconductor chip 20 is not formed is generated on a face of the semiconductor chip 10 at the side of the semiconductor chip 20. For instance, it is possible to provide external interconnects on this region. Consequently, it becomes not necessary to provide the external interconnects on the uppermost chip (the semiconductor chip 40 corresponds to this in the semiconductor device 1); there can be realized further height reduction of the semiconductor device 1.

A plurality of the semiconductor chips are provided on the base wafer 80. Having such configuration, it is possible to manufacture the plurality of semiconductor devices simultaneously; therefore, manufacturing productivity of the semiconductor device is improved.

Moreover, since there is provided the through electrode 50 on the semiconductor chip 20, it is possible to easily achieve conductivity between the semiconductor chip 20 and the semiconductor chip 40. Further, the effect of improvement of processing speed and the realizing low power consumption or the like as compared with the case where conductivity between the semiconductor chip 20 and the semiconductor chip 40 is performed by the wire bonding or the like is obtained. Furthermore, since the through electrode 50 is manufactured in the same process as forming process of the protective film 38, the semiconductor chip 20 provided with the through electrode 50 can be obtained without increase of the number of process.

However, it is not indispensable to provide the through electrode 50 in the present embodiment. Also, after the semiconductor chip 20 is formed on the semiconductor chip 10 with the layered structure, it may be suitable that the above conductivity is achieved by forming a hole penetrating the semiconductor substrate 22 from a back surface of the semiconductor chip 20 and by filling the conductive material into the hole. Moreover, it is suitable that an external electrode terminal may be formed on the layered semiconductor chip 20 in such a way as to connect with the conductive material. It is suitable that the semiconductor chip that such an external electrode terminal is formed may be any of the semiconductor chip 10, the semiconductor chip 20 and the semiconductor chip 40.

The insulating layer 34 includes a SiN film 344. For this reason, the insulating layer 34 also suitably functions as a metal diffusion barrier preventing diffusion of heavy metal or the like. Furthermore, the insulating layer 34 is also capable of being functioned as the metal diffusion barrier in the case that the insulating layer 34 includes a SiON film or a SiCN film.

While the embodiments of the present invention have been described above in reference to the annexed figures, it should be understood that the descriptions above are presented for the purpose of illustrating the present invention, and various configurations other than the above-described configurations can also be adopted.

For example, the semiconductor device 1 described above is capable of being incorporated in arbitrary system by incorporating into a general semiconductor package using wire bonding technique or by performing mounting with the flip chip bonding technique or the like.

It should be noted that, in the above described embodiment, to provide the semiconductor chip 40 on the semiconductor device 1 or the semiconductor wafer 3 is not indispensable, it is suitable that it may result in constitution where the semiconductor chip 20 becomes a chip of the uppermost layer. Moreover, it is not indispensable that the insulating layer 34 is composed of a multilayered film; for instance, it is also suitable that the insulating layer 34 may be a single layer film constituted by a SiO$_2$ film.

In addition, to provide transistors or the like on the semiconductor chip 20 is not indispensable. For instance, when adopting constitution in which only the passive element or the through electrode are provided in the semiconductor chip 20, it is possible to suitably use the semiconductor chip 20 as the silicon interconnect substrate. However, also in this case, the first protective film (insulating layer 34) and the second protective film (protective film 38) are provided in the semiconductor chip 20.

Furthermore, the semiconductor chip 10 has the through electrode formed on the semiconductor substrate 12; and there may be adopted constitution where the through electrode is led to the lower face (opposite side surface to the semiconductor chip 20) of the semiconductor chip 10.

Moreover, it is suitable that there may be provided rerouting forming process after the chip is formed into the layered structure. The rerouting is connected to the arbitrary semiconductor chip, moreover, it is possible to use also forming of the external electrode.

Also, in the semiconductor device 1, it is suitable that a plurality of semiconductor chips 20 may be provided on the semiconductor chip 10.

Figure 11:
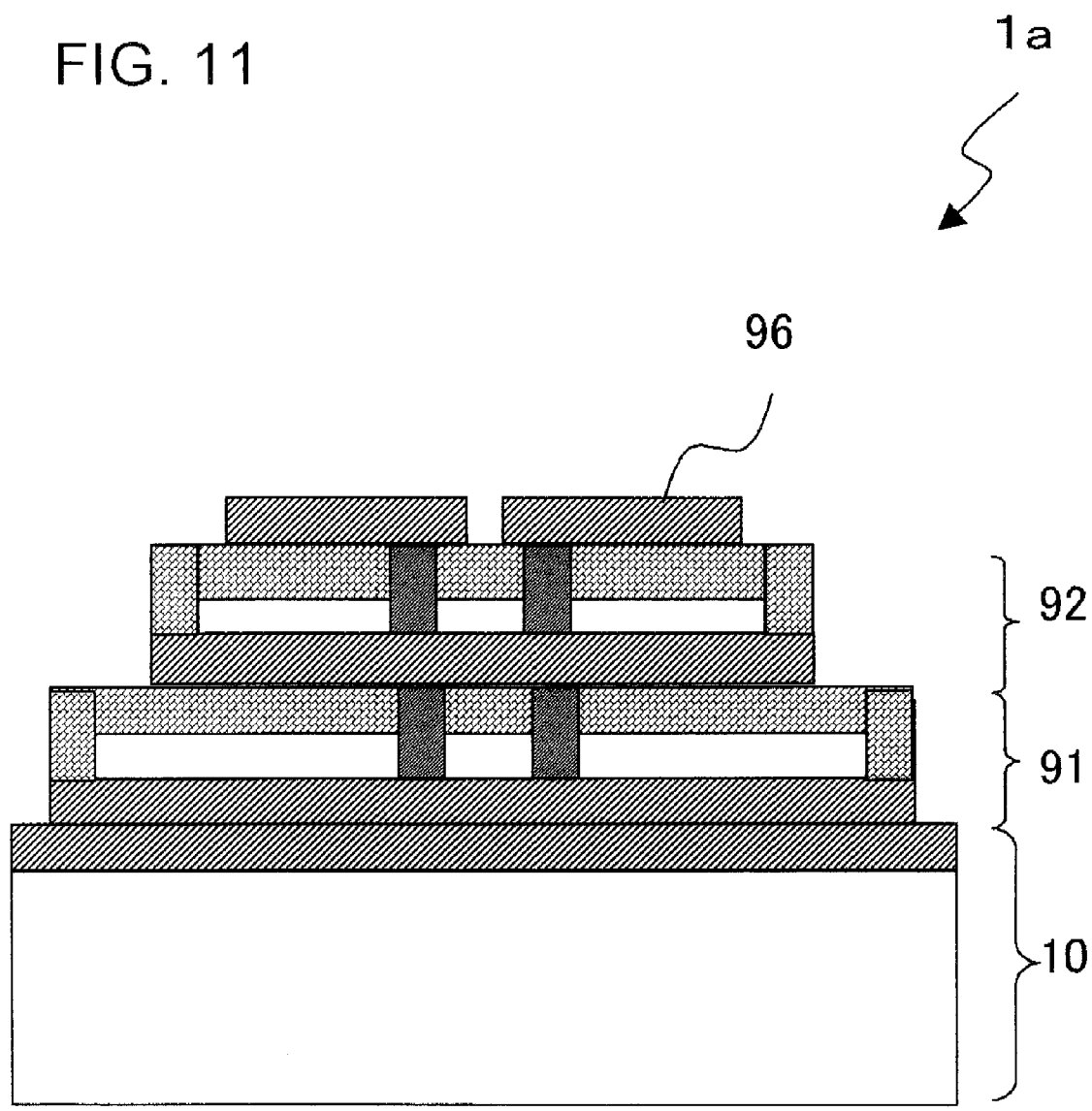
FIG. 11 is a cross sectional view schematically showing a structure of the semiconductor device according to the embodiment.

FIG. 11 is a cross-sectional view showing one modified example of the semiconductor device 1 shown in FIG. 1. In a semiconductor device 1a, a semiconductor chip 91 and a semiconductor chip 92 are sequentially formed on the semiconductor chip 10 with the layered structure. Furthermore, a rerouting (external electrode) 96 is provided on the semiconductor chip 92. A structure of the semiconductor chip 91 and the semiconductor chip 92 is the substantially same as the semiconductor chip 20 shown in FIG. 1. Here, area of the chip area gradually decreases in order of the semiconductor chip 10, the semiconductor chip 91 and the semiconductor chip 92.

Figure 12:
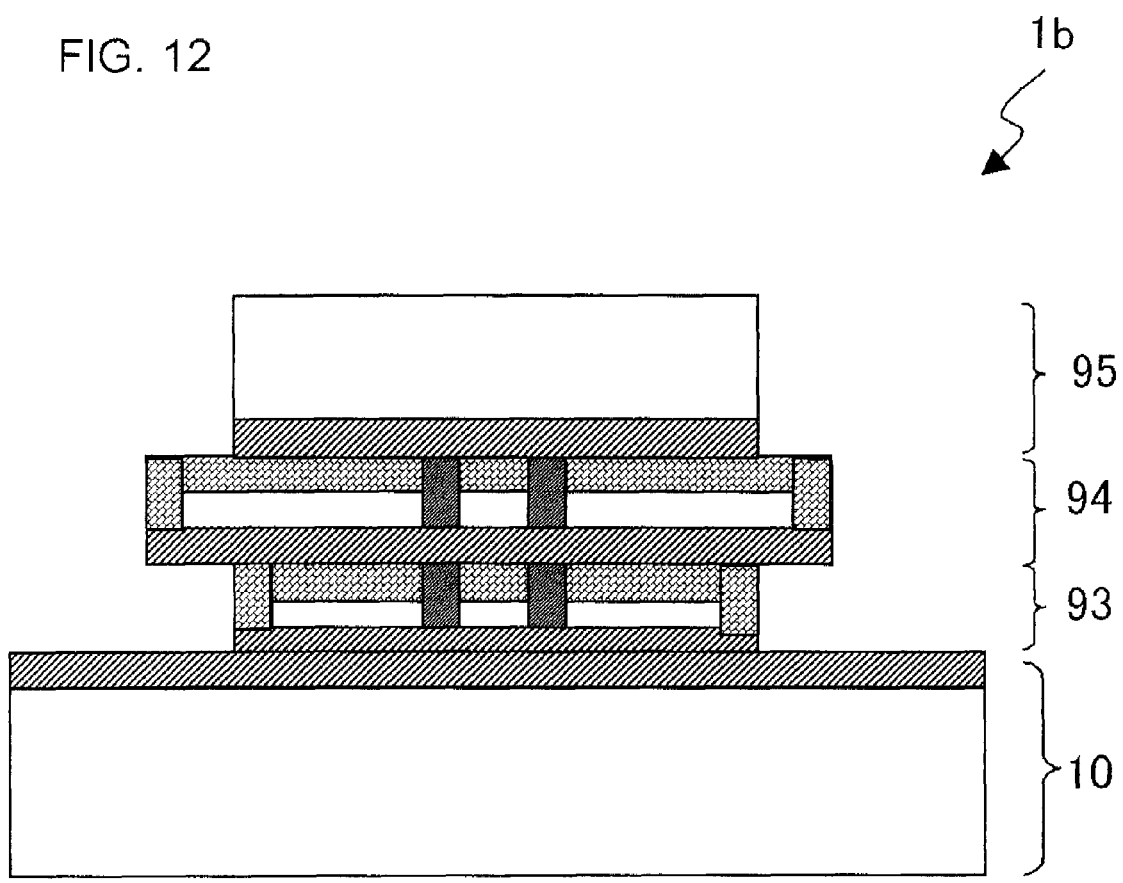
FIG. 12 is a cross sectional view schematically showing a structure of the semiconductor device according to the embodiment.

FIG. 12 is a cross-sectional view showing another modified example of the semiconductor device 1 shown in FIG. 1. In a semiconductor device 1b, a semiconductor chip 93, a semiconductor chip 94 and a semiconductor chip 95 are sequentially formed on the semiconductor chip 10 with the layered structure. A structure of the semiconductor chip 93 and a structure of the semiconductor chip 94 are the substantially same as the semiconductor chip 20 shown in FIG. 1. Moreover, a structure of the semiconductor chip 95 is the substantially same as the semiconductor chip 40 shown in FIG. 1. Here, a chip area of the semiconductor chip 93 is smaller than the area of the semiconductor chip 10, a chip area of the semiconductor chip 94 is larger than the area of the semiconductor chip 93, and a chip area of the semiconductor chip 95 is smaller than the area of the semiconductor chip 94.

As known from FIG. 11 and FIG. 12, in the semiconductor device 1 of the above described embodiment, it is possible to freely select a chip size to form layered structure. It should be noted that, as shown in FIG. 12, when relatively large chip (semiconductor chip 94) is formed on relatively small chip (semiconductor chip 93) into the layered structure, it is preferable that also the upper surface of the semiconductor chip 94 (surface at the side of the semiconductor chip 93) is provided employing material having an etchant resistance.

It is apparent that the present invention is not limited to the above embodiment that modified and changed without departing from the scope and spirit of the invention.

What is claimed is:

1. A semiconductor device comprising:
   a first semiconductor chip;
   a second semiconductor chip, which has a semiconductor substrate including a circuit forming region, formed on said first semiconductor chip,
   wherein said second semiconductor chip has a first protective film covering a face opposite to said first semiconductor chip in said circuit forming region and has a second protective film covering an outer side face of said circuit forming region; and
   a through electrode penetrating from a first side surface of said first protective film through a second side surface of said first protective film and said circuit forming region,
   wherein an area of said first semiconductor chip is larger than an area of said second semiconductor chip and wherein said second semiconductor chip includes a plurality of conductors penetrating through said first protective film and said circuit forming region and contacting an interconnect layer that directly connects another interconnect layer on said first semiconductor chip.

2. The semiconductor device according to claim 1, wherein an area of said first semiconductor chip is larger than an area of said second semiconductor chip.

3. The semiconductor device according to claim 1, wherein said semiconductor substrate is constituted by comprising an insulating layer functioning as said first protective film, and a silicon layer, which is provided on said insulating layer, including said circuit forming region, and wherein said insulating layer is exposed on a face opposite to said first semiconductor chip in said second semiconductor chip.

4. The semiconductor device according to claim 1, wherein said second semiconductor chip has an interconnect layer at a lower part of said circuit forming region, and wherein a third protective film is provided so as to cover said interconnect layer.

5. The semiconductor device according to claim 1, wherein said second semiconductor chip includes a conductor penetrating said semiconductor substrate in said circuit forming region.

6. The semiconductor device according to claim 5, wherein said semiconductor device includes a third semiconductor chip formed on said second semiconductor chip, and wherein said second semiconductor chip is electrically connected to said third semiconductor chip via said conductor.

7. The semiconductor device according to claim 1, wherein said circuit forming region is surrounded by said second protective film.

8. A semiconductor wafer comprising:
   a base wafer;
   a semiconductor chip, which has a semiconductor substrate including a circuit forming region, formed on said base wafer,
   wherein said semiconductor chip has a first protective film covering a face opposite to said base wafer in said circuit forming region and has a second protective film covering an outer side face of said circuit forming region; and
   a through electrode penetrating from a first side surface of said first protective film through a second side surface of said first protective film and said circuit forming,
   wherein an area of said base wafer is larger than an area of said semiconductor chip and wherein said semiconductor chip includes a plurality of conductors penetrating through said first protective film and said circuit forming region and contacting an interconnect layer that directly connects another interconnect layer on said base wafer.

9. The semiconductor wafer according to claim 8, wherein a plurality of said semiconductor chips are provided on said base wafer at a predetermined interval.

10. The semiconductor wafer according to claim 8, wherein said semiconductor chip has an interconnect layer at a lower part of said circuit forming region, and wherein there is provided a third protective film is provided so as to cover said interconnect layer.

11. The semiconductor wafer according to claim 8, wherein said semiconductor chip includes a conductor penetrating a semiconductor substrate in said circuit forming region.

12. The semiconductor wafer according to claim 11, wherein said semiconductor wafer includes an upper part semiconductor chip formed on said semiconductor chip, and wherein said semiconductor chip is electrically connected to said upper part semiconductor chip via said conductor.

13. A semiconductor device comprising:
a first semiconductor chip;
a second semiconductor chip, which has a semiconductor substrate including a circuit forming region, formed on said first semiconductor chip,
wherein said second semiconductor chip has a first protective film covering a face opposite to said first semiconductor chip in said circuit forming region and has a second protective film covering a side face at an outer periphery of said circuit forming region; and
a through electrode penetrating from a first side surface of said first protective film through a second side surface of said first protective film and said circuit forming region,
wherein an area of said first semiconductor chip is larger than an area of said second semiconductor chip and wherein said second semiconductor chip includes a plurality of conductors penetrating through said first protective film and said circuit forming region and contacting an interconnect layer that directly connects another interconnect layer on said first semiconductor chip.

* * * * *